United States Patent
Dür et al.

(10) Patent No.: US 11,373,896 B2
(45) Date of Patent: Jun. 28, 2022

(54) PNEUMATIC PIN LIFTING DEVICE AND PNEUMATIC LIFT CYLINDER

(71) Applicant: VAT HOLDING AG, Haag (CH)

(72) Inventors: Michael Dür, Hohenweiler (AT); Martin Kienreich, Hörbranz (AT)

(73) Assignee: VAT HOLDING AG, Haag (CH)

( * ) Notice: Subject to any disclaimer, the term of this patent is extended or adjusted under 35 U.S.C. 154(b) by 372 days.

(21) Appl. No.: 16/485,728

(22) PCT Filed: Feb. 12, 2018

(86) PCT No.: PCT/EP2018/053403
§ 371 (c)(1),
(2) Date: Aug. 13, 2019

(87) PCT Pub. No.: WO2018/149780
PCT Pub. Date: Aug. 23, 2018

(65) Prior Publication Data
US 2019/0393073 A1     Dec. 26, 2019

(30) Foreign Application Priority Data

Feb. 14, 2017   (EP) .................................... 17156138

(51) Int. Cl.
*H01L 21/687* (2006.01)
(52) U.S. Cl.
CPC .............................. *H01L 21/68742* (2013.01)
(58) Field of Classification Search
CPC ......... H01L 21/67259; H01L 21/68742; H01L 21/68792; F15B 11/123; F15B 11/06
See application file for complete search history.

(56) References Cited

U.S. PATENT DOCUMENTS

| 2,969,042 A | 1/1961 | Litz et al. |
| 6,302,249 B1 | 10/2001 | Jolly et al. |

(Continued)

FOREIGN PATENT DOCUMENTS

| CN | 101446095 A | 6/2009 |
| CN | 102176425 A | 9/2011 |

(Continued)

OTHER PUBLICATIONS

International Search Report and Written Opinion dated Feb. 12, 2018 in International Application No. PCT/EP2018/053403.

(Continued)

*Primary Examiner* — Peter B Kim
(74) *Attorney, Agent, or Firm* — Muncy, Geissler, Olds & Lowe, P.C.

(57) ABSTRACT

Disclosed is a pin lifting device for moving and positioning a substrate. Also, a pneumatic drive cylinder is provided having a cylindrical housing enclosing a first internal volume and a first piston assembly, having a first piston and a first piston rod. The first piston assembly can be moved into a fitting position by pressurization of the first internal volume. The device has at least one supporting pin connected to the first piston rod. The drive cylinder has a second piston assembly, which has a second piston and a second piston rod. The second piston assembly is arranged for motion coaxial to the first piston assembly. An end surface of the second piston rod faces the first piston. The first and second piston assemblies are arranged so the first piston and the second piston rod have no contact in the fitting position.

16 Claims, 5 Drawing Sheets

(56) References Cited

U.S. PATENT DOCUMENTS

Figure 1:
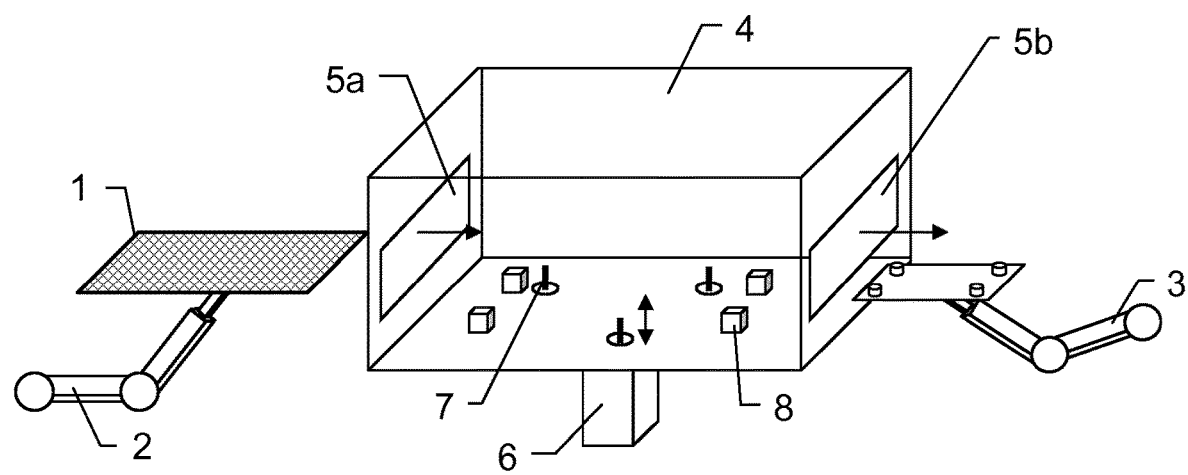

| | | |
|---|---|---|
| 6,305,677 B1 | 10/2001 | Lenz |
| 6,481,723 B1 | 11/2002 | Hao et al. |
| 6,646,857 B2 | 11/2003 | Anderson et al. |
| 2002/0079307 A1 | 6/2002 | Choi |
| 2003/0054668 A1 | 3/2003 | Kitano et al. |
| 2005/0092438 A1 | 5/2005 | Hur et al. |
| 2008/0108154 A1 | 5/2008 | Son |
| 2009/0049981 A1 | 2/2009 | Hayashi et al. |
| 2013/0059447 A1 | 3/2013 | McMillin et al. |

FOREIGN PATENT DOCUMENTS

| | | |
|---|---|---|
| CN | 101446095 B | 11/2012 |
| CN | 205247063 U | 5/2016 |
| CN | 105637669 A | 6/2016 |
| JP | H07-33973 U | 6/1995 |
| JP | 2000-018207 A | 1/2000 |
| JP | 2001053132 A | 2/2001 |
| JP | 2002-540624 A | 11/2002 |
| JP | 2009-054630 A | 3/2009 |
| JP | 2012-521652 A | 9/2012 |
| JP | 2013-062301 A | 4/2013 |
| KR | 20040009691 A | 1/2004 |
| KR | 20040096911 A | 1/2004 |
| WO | 2000059007 A1 | 10/2000 |
| WO | 2010109373 A2 | 9/2010 |
| WO | WO-2016006437 A1 * | 1/2016 ............ F16C 29/004 |

OTHER PUBLICATIONS

Yang, Chunhui et al. AMESim: "Analysis and design of Lifting Oil Cylinder Support with Floating Support Structure Based on AMESim and FEM", DOI: 10.3969/j. issn. 1000-1298, 2010,09,041.

Fan, Zhang et al. "The Removal of Deformed Submicron Particles from Silicon Wafers by Spin Rinse and Megasonics", 1349 Moffett Park Drive, AlliedSignal Inc., Sunnyvale, CA 94089 #Clarkson University, Potsdam, NY 13699, Journal of Electronic Materials, Feb. 2000.

* cited by examiner

PNEUMATIC PIN LIFTING DEVICE AND PNEUMATIC LIFT CYLINDER

This application is a 371 National Phase of PCT Application No. PCT/EP2018/053403, filed on Feb. 12, 2018; which claims priority to European Patent application 17156138.4 filed Feb. 14, 2017 and each of which is herein incorporated by reference in its entirety.

The invention relates to a pneumatic pin lifting system having a pneumatic lift cylinder and at least one support pin coupled to the lift cylinder for moving and positioning a substrate in a process chamber and a pneumatic lift cylinder having a settable stop point.

Pin lifting systems, also called pin lifters, are typically conceived and provided for the accommodation and defined positioning of a substrate to be processed in a process chamber. They are used in particular in vacuum chamber systems in the field of IC, semiconductor, flat-panel, or substrate manufacturing, which has to take place in a protected atmosphere as much as possible without the presence of contaminating particles.

Such vacuum chamber systems comprise in particular at least one vacuum chamber, which is provided for accommodating semiconductor elements or substrates to be processed or produced, and which can be evacuated and which has at least one vacuum chamber opening, through which the semiconductor elements or other substrates can be guided into and out of the vacuum chamber. For example, in a manufacturing facility for semiconductor wafers or liquid crystal substrates, the highly sensitive semiconductor or liquid crystal elements pass through multiple process vacuum chambers sequentially, in which the parts located inside the process vacuum chambers are each processed by means of a processing device.

Such process chambers frequently have at least one transfer valve, the cross section of which is adapted to the substrate and robot and through which the substrate can be introduced into the vacuum chamber and possibly removed after the provided processing. Alternatively, for example, a second transfer valve can be provided, through which the processed substrate is moved out of the chamber.

The guiding of the substrate, for example, a wafer, takes place, for example, using a correspondingly designed and controlled robot arm, which can be guided through the opening of the process chamber which can be provided with the transfer valve. The equipping of the process chamber then takes place by means of gripping of the substrate using the robot arm, moving the substrate into the process chamber, and defined depositing of the substrate in the chamber. The emptying of the process chamber takes place in a corresponding manner.

A comparatively high accuracy and mobility of the substrate has to be ensured for the depositing of the substrate and for the accurate positioning of the substrate in the chamber. For this purpose, pin lifting systems are used which provide a plurality of support points for the substrate and thus a load distribution (because of the intrinsic weight of the substrate) over the entire substrate.

The substrate is deposited by means of the robot on the extended support pins of the lifting system and is deposited on a carrier, for example, a potential plate, by lowering the pins. For this purpose, the robot arm, which typically carries the substrate, is moved out of the chamber. The pins can be lowered further after the depositing of the substrate and are then provided separated therefrom, i.e., no contact exists between the pins and the substrate. After removal of the robot arm and closing (and introduction of process gas and/or evacuation) of the chamber, the processing step is carried out.

A low force action on the substrate is very important in particular even after carrying out the process step in the chamber and during subsequent lifting of the substrate. The substrate typically has a relatively smooth surface, which comes into contact with the carrier upon the depositing and rests thereon. In this way, a type of adhesion can result—for example, caused by air enclosures—during the attempt to detach the substrate from the carrier due to a partial vacuum acting between the substrate and the carrier. If the substrate is pressed away from the carrier excessively rapidly, a fracture of the substrate can occur in this case, since the adhesive forces cannot be overcome or released at least at certain support points. Moreover, as the contact comes into existence between the support pins and the substrate, an impact on the substrate occurring in this case can result in undesired stress (or fracture). A corresponding force action on the substrate is thus a critical factor in the substrate handling inside the chamber.

At the same time, in addition to the softest and most careful handling possible of the substrates to be processed, the shortest possible processing time is also to be enabled. This means that the substrate can be moved as rapidly as possible into the defined states—loading and unloading position and processing position—in the chamber.

To avoid undesired shocks during, for example, the processing of semiconductor wafers, U.S. Pat. No. 6,481,723 B1 proposes the use of a special stopping device instead of hard movement stops in a pin lifter. Possible hard plastic stops are to be replaced here by a combination of a softly formed stop part and a hard stop part, wherein, for the movement delimitation, first the contact with the soft stop part is established and subsequently and in a correspondingly damped manner, the hard stop is brought into contact.

U.S. Pat. No. 6,646,857 B2 proposes a regulation of the lifting movement by means of a detected occurring force. The support pins can be moved here in dependence on the received force signal so that the lifting force on the support pins always acts in a correspondingly metered and controlled manner on the wafer.

However, the two mentioned approaches raise further difficulties, which generally relate to the control of the lifting device. For example, a two-part stop element cannot provide a desired soft lifting of a wafer alone. For this purpose, a correspondingly adapted controller of the drive is moreover necessary. A regulator instead of a controller also provides an additional complexity due to increased expenditure and may not be capable of recognizing, for example, possible disturbances in the system (for example, occurring friction forces), but rather typically attempts to "override" such a disturbance. Thus, firstly, a significantly more complex system is provided and, secondly, a possible error recognition is precluded by the proposed solutions.

A further aspect for work processes under vacuum conditions and with applied potentials is the possible influence due to electric and/or magnetic interference sources. In this context, possible influences on the processing process are also to be taken into consideration in particular in the design of a pin lifting system. Thus, for example, US 2005/0092438 A1 proposes a lifting device, the support pins can be electrically separated from a control plate by means of a nonconductive material.

However, it remains disadvantageous in this solution that a part of the lifting system connected to the electric drive is provided in the process chamber and at the same time can still form a corresponding interfering variable.

It is therefore the object of the present invention to provide an improved pin lifting system which, on the one hand, provides monitored lifting of a substrate and moreover avoids a system-related potential interference with a processing process due to, for example, electromagnetic influences.

Moreover, it is the object of the invention to provide such an improved pin lifting system in such a way that a planned lifting of a workpiece can take place rapidly and nondestructively.

The invention is furthermore based on the object of providing a drive concept for a pin lifting device having a correspondingly improved design.

These objects are achieved by the implementation of the characterizing features of the independent claims. Features which refine the invention in an alternative or advantageous manner can be inferred from the dependent patent claims.

The present invention relates to a drive concept for a pin lifting device and/or directly to a pin lifting device equipped therewith. The drive is proposed in the form of a pneumatic (lift) cylinder having a restoring device. By means of a pneumatic design, possible interfering influences as a result of electromagnetic fields are avoided in comparison to electrically driven drives. In this way, a more reliable processing process in a vacuum chamber equipped therewith is thus already provided.

With respect to the problem of careful lifting of a workpiece (substrate) provided in the vacuum process chamber, for example, a semiconductor wafer, in conjunction with the shortest possible processing time nonetheless, the solution according to the invention provides the lift cylinder with a doubled piston arrangement. A critical lifting movement can be implemented in two phases using such an embodiment. In a first phase, the substrate is lifted comparatively slowly from a support using moderate and possibly increasing force action.

The support can be, for example, a level and smooth plate, with which a substrate, which is also smooth, coheres upon contact, since an adhesion can occur between the two contact surfaces (for example, because of occurring short range forces, for example, van der Waals forces) and the substrate may therefore only be separated from the support again with a certain application of force.

The first lifting phase is continued up to a specific movement point, in particular until the substrate is provided completely separated from the support.

A transition then takes place into a second, faster movement phase. The transition point is definable by the design and/or setting of the drive (lift cylinder).

In the first phase, the movement is substantially effectuated using a lower piston of the lift cylinder, in the second phase substantially using an upper piston. However, the effects of the piston forces can also be phase-overlapping, i.e., a lifting force caused by the lower piston does not exclusively have to effectuate the first movement phase, but rather can also co-influence the second movement phase. The pistons are arranged in particular so that both are movable along a common movement axis (for example, center perpendicular with respect to the footprint of the lift cylinder) in the interior of the cylinder.

The forces on the two pistons are implemented by respective pressure applications in corresponding pressure regions (volumes) associated with the piston. These volumes are provided sealed off in relation to one another, so that a defined lifting force or lifting force profile can be set and possibly varied for each piston. This takes place, for example, by means of a corresponding design of the air supply lines for the volumes having, for example, adjustable apertures in compressed air ducts. The lifting force profile can be determined by the inflow of compressed air thus settable.

Different lifting forces at equal pressure can be implemented, for example, by a design of different piston surfaces.

The invention thus relates to a pin lifting device, in particular a pin lifter, for the movement (lifting and lowering) and positioning (for example, on a shelf in a processing position) of a substrate to be processed, in particular a wafer, in a vacuum chamber.

The pin lifting device has a pneumatic drive cylinder having a cylindrical housing enclosing a first cylindrical inner volume and a first piston arrangement, movably arranged along a movement axis extending parallel or coaxially to a longitudinal axis, having a first piston and a first piston rod. The longitudinal axis is defined by the first cylindrical inner volume. The first piston also delimits the first inner volume in this case. The first piston rod protrudes out of the cylindrical housing. The first piston arrangement is displaceable by a pressure application to the first inner volume, in particular to a restored zero position in an extended equipping position.

Piston and piston rod can be formed in particular as one part, i.e., integrally. Two-part embodiments are also conceivable, wherein the piston rod is, for example, screwed together with the piston.

The pin lifting device moreover has at least one support pin movable at least essentially parallel or coaxially in the direction of the longitudinal axis, wherein the support pin is connected to an outer end of the first piston rod provided outside the cylindrical housing and the support pin is accordingly linearly movable by a movement of the first piston arrangement.

The drive cylinder furthermore has a second piston arrangement having a second piston and a contact surface, wherein the second piston delimits a second inner volume enclosed by the cylindrical housing, in particular wherein the first and the second inner volumes are provided separated from one another by the second piston. The second piston arrangement is movably arranged at least essentially coaxially in relation to the mobility of the first piston arrangement. The contact surface faces in the direction of the first piston.

The first piston arrangement and the second piston arrangement are arranged in such a way that the first piston arrangement and the contact surface are provided without contact in the equipping position and the first piston arrangement and the contact surface are in mutual contact in a retracted processing position.

The retracted processing position is in particular the position of the second position in its most lowered position. In this position, the second inner volume has the smallest possible dimensions in the scope of the movement of the second piston.

In one embodiment, the second piston arrangement has a second piston rod and an end surface of the second piston rod faces in the direction of the first piston arrangement. The end surface forms the contact surface of the second piston arrangement in this case. The first piston and the second piston rod are provided without contact in the equipping position and contact one another in the retracted processing position by means of the contact surface.

In a further embodiment, the first piston rod can be formed in such a way that a free inner end (provided in the interior of the housing) of the first piston rod, which is opposite to the outer end of the first piston rod, faces in the direction of the contact surface, wherein the first piston rod and the contact surface are provided without contact in the equipping position and the first piston rod and the contact surface are in contact in a retracted processing position. In particular, the first piston rod can be formed extending through the first piston and can be arranged in a fixed position in relation to the first piston, in particular by means of a screw connection.

The contact surface of the second piston arrangement can be in particular a part of a surface of the second piston facing in the direction of the first piston. The second piston is designed as a disk-like cylindrical element in this embodiment.

In one embodiment, the drive cylinder has a lower (second) compressed air duct, which is arranged in such a way that the second, lower and in particular the first, upper piston arrangement is adjustable from the retracted processing position into a transition position by a pressure application to the second inner volume by way of the second compressed air duct. The lower compressed air duct is thus connected to the second inner volume and enables an introduction of compressed air into this volume.

Moreover, the drive cylinder has an upper (first) compressed air duct, which is arranged in such a way that the first piston arrangement is adjustable from the transition position into the extended equipping position by a pressure application to the first inner volume by way of the first compressed air duct. The upper compressed air duct is thus connected to the first inner volume and enables an introduction of compressed air into this first volume.

In one embodiment, the upper compressed air duct can furthermore be formed and arranged in such a way that by means of a compressed air introduction through this duct, the first piston can be lifted or pressed from a zero position (i.e., the piston is located on a stop in a lowered, retracted position in the housing) into the equipping position.

In particular, the pin lifting device has a control unit for activating respective compressed air regulating elements for the first and the second compressed air ducts, wherein the control unit has a specifically configured lifting function for moving the first piston arrangement into an extended equipping position. Upon execution of the lifting function, the compressed air regulating element for the second compressed air duct is activated in such a way that the compressed air regulating element for the second compressed air duct provides the pressure application to the second inner volume and subsequently the compressed air regulating element for the first compressed air duct is controlled in such a way that it provides the pressure application to the first inner volume with a specific time offset in relation to the pressure application to the second inner volume. The time offset is dependent on reaching the transition position using the second piston or is predetermined in a chronologically controlled manner by the lifting function. I.e., the pressure application to the first inner volume can be initiated, for example, using a mechanism in such a way that the mechanism enables the pressure application only upon reaching the transition position. The chronological control can take place electronically, for example, wherein a pressure valve can be switched or regulated accordingly.

According to one embodiment of the invention, the drive cylinder defines at least one stop point for a movement of the first or the second piston arrangement, in particular of the first or second piston, wherein the at least one stop point defines the extended equipping position, the retracted processing position, or the transition position. The stop point thus represents a movement delimitation for at least one of the pistons in the longitudinal direction.

In particular, the position of the at least one stop point is variable in a defined stop range with respect to the longitudinal axis, in particular wherein an extension of the stop range is at least 0.5 mm or 1 mm in the direction of the longitudinal axis. In other words, the stop point can be adjusted within a specific range.

Due to such a setting ability, for example, a lowered position of the at least one support pin can be set, defined, and changed. The transition point from the first lifting phase to the second lifting phase can be corresponding, i.e., the extent to which a moderate lifting of the substrate is to take place and from which point a more rapid lifting movement can be initiated.

In one embodiment of the device, the housing has at least two—in particular radially opposing—recesses, wherein the recesses penetrate the housing wall. An extension of the recesses in a direction parallel to the longitudinal axis defines the stop range.

In particular, the drive cylinder has at least one stop element positioned in the recesses, in particular a crossbeam, having a defined height in the direction of the longitudinal axis, wherein the height is less than the extension of the recesses, and moreover has at least one adjustment mechanism interacting with the stop element. The stop element is preferably provided in the first or second inner volume in such a way that a barrier for the movement distance of the first and/or the second piston is provided thereby. The respective piston then in particular runs into the stop element.

In one embodiment, the stop element is designed and arranged having a central recess in such a way that the first or the second piston rod protrudes through this central recess and thus a delimitation point is provided for the movement of the end surface of the piston rod remote from the stop point, in particular offset by the length of the piston rod.

The stop element can alternatively be embodied, for example, as star-shaped, hexagonal, or as a perforated plate, wherein a certain quantity of air per unit of time flowing around or through the stop element is ensured, in particular in the case of known differential pressure. The recesses in the housing wall can be correspondingly provided accordingly. The stop element can in general be mounted in a rotation-locked manner.

Furthermore, the adjustment mechanism can be designed as a ring having an internal thread and can be arranged on the housing outer side, and/or peripherally around the housing. The stop element can have in this context, in the region of the recesses, a segment of an external thread corresponding to the internal thread. The stop element is then formed in such a way, in particular with respect to its dimensioning in regard to an internal and/or external diameter of the inner volume or the housing, respectively, that the internal thread interacts with the external thread. In this way, the external thread of the stop element thus runs in the internal thread of the ring, wherein the stop element is preferably mounted (in the recesses) so that it is not pivotable around the longitudinal axis. The position of the stop element can be varied and set in this configuration within the defined stop range along an adjustment axis extending parallel to the longitudinal axis by means of rotation of the ring. The at least one stop point is adjustable accordingly in this case.

A defined pitch of the thread establishes the lifting distance for the stop element along the adjustment axis per revolution of the ring.

In one embodiment, the drive cylinder can have at least one restoring functionality, by means of which a restoring force can be provided, which acts on the first and/or the second piston arrangement in such a way that it is pressed into the retracted processing position. Lowering of the piston into the cylinder can be effectuated using this restoring functionality, in particular in the event of a reduction of the internal pressure in the inner volumes or in the event of venting of the inner volumes.

This restoring functionality can be designed as a restoring element, in particular as a restoring spring, which is arranged in such a way that the restoring force acts directly on the first piston and, in the event of a contact between first piston and contact surface and/or second piston rod, acts indirectly on the second piston arrangement.

Alternatively or additionally, the restoring functionality can be designed as a controllable, in particular pneumatic restoring mechanism, wherein the restoring force on the first piston is settable by pressure application, in particular with respect to its amount and profile. A counter force against the lifting force is induced here by generation and increase of a pressure in a volume which is reduced in size during the stroke of the first piston.

It is obvious that the pneumatic drive cylinder of the pin lifting device can be refined according to one of the embodiments described hereafter of the pneumatic drive cylinder. This relates in particular to embodiments of an adjustment mechanism (for example, by means of a ring) for the setting of a stop point.

The invention additionally relates to a pneumatic drive cylinder, in particular a lift cylinder, in particular for a pin lifting device or a pin lifter or a general drive device, having a cylindrical housing enclosing a first cylindrical inner volume and a first piston arrangement, which is movably arranged along a movement axis extending parallel or coaxially in relation to a longitudinal axis, having a first piston and a first piston rod. The longitudinal axis is defined by the first cylindrical inner volume. The first piston delimits the first inner volume and the first piston rod protrudes out of the cylindrical housing. The first piston arrangement is adjustable into an extended equipping position by a pressure application to the first inner volume.

The cylinder additionally has a coupling element provided on an outer end of the first piston rod provided outside the cylindrical housing for connecting the first piston rod to a component to be moved by means of the drive cylinder, in particular a support pin of a pin lifting device, and a second piston arrangement having a second piston and a contact surface. The second piston delimits a second inner volume enclosed by the cylindrical housing, in particular wherein the first and the second inner volumes are separated from one another by the second piston. The second piston arrangement is movably arranged at least substantially coaxially in relation to the first piston arrangement, in particular the second piston arrangement is movable along the movement axis. The contact surface of the second piston arrangement faces in the direction of the first piston and the second and in particular the first piston arrangement is adjustable from a retracted processing position into a transition position by a pressure application to the second inner volume.

The first piston arrangement and the second piston arrangement are arranged in such a way that the first piston arrangement and the contact surface are provided without contact in the extended equipping position and the first piston arrangement and the contact surface are in contact in a retracted processing position.

According to the invention, the drive cylinder has at least one stop point for a delimitation of a movement distance of the first and/or the second piston arrangement, in particular of the first or second piston, wherein the at least one stop point defines the extended equipping position, the retracted processing position, and/or the transition position. The position of the at least one stop point is variable within a defined stop range with respect to the longitudinal axis, in particular wherein an extension of the stop range is at least 0.5 mm or 1 mm along an adjustment axis extending parallel to the longitudinal axis.

In one embodiment of the cylinder, the second piston arrangement has a second piston rod and an end surface of the second piston rod faces in the direction of the first piston arrangement. The end surface forms the contact surface of the second piston arrangement in this case. The first piston and the second piston rod are provided without contact in the equipping position and contact one another in the retracted processing position by means of the contact surface.

In a further embodiment, the first piston rod can be formed in such a way that a free inner end (provided in the interior of the housing) of the first piston rod, which is opposite to the outer end of the first piston rod, faces in the direction of the contact surface, wherein the first piston rod and the contact surface are provided without contact in the equipping position and the first piston rod and the contact surface are in contact in a retracted processing position. In particular, the first piston rod can be formed extending through the first piston and can be arranged in a fixed position, in particular by means of a screw connection, in relation to the first piston.

The contact surface of the second piston arrangement can in particular be a part of a surface of the second piston facing in the direction of the first piston. In this embodiment, the second piston is designed as a disk-like cylindrical element.

In one embodiment of the cylinder, the housing can have at least two recesses, which are radially opposing in particular, wherein the recesses penetrate the housing wall, and wherein an extension of the recesses along the adjustment axis defines the stop range.

In particular, the drive cylinder has at least one stop element arranged in the recesses, in particular a crossbar, having a defined height in the direction of the adjustment axis, wherein the height is less than the extension of the recesses. The drive cylinder can then moreover have at least one adjustment mechanism interacting with the stop element.

According to one embodiment, the adjustment mechanism can be designed as a ring having an internal thread and can be arranged on the housing outer side. The stop element can have a segment of an external thread corresponding to the internal thread in the region of the recesses and the stop element can furthermore be formed in such a way, in particular with respect to its dimensioning in regard to an internal and/or external diameter of the inner volume or the housing, respectively, that the internal thread interacts with the external thread. The position of the stop element can be varied and set in this way within the defined stop range along the adjustment axis by means of rotation of the ring, wherein the at least one stop point is adjustable.

In a further embodiment, the drive cylinder has at least one restoring functionality, by means of which a restoring force can be provided, which acts on the first and/or the second piston arrangement in such a way that it is pressed into the retracted processing position.

This restoring functionality can be designed as a restoring element, in particular as a restoring spring, which is arranged in such a way that the restoring force acts directly on the first piston and, in the event of a contact between first piston and contact surface and/or second piston rod, acts indirectly on the second piston arrangement.

Alternatively or additionally, the restoring functionality of the drive cylinder can be designed as a controllable, in particular pneumatic restoring mechanism, wherein the restoring force on the first piston is settable by pressure application, in particular with respect to its amount and profile. In this way, a counterforce against the lifting force is induced by generating and increasing a pressure in a volume which is reduced in size during the stroke of the first piston.

In one embodiment of the drive cylinder, this cylinder has a lower (second) compressed air duct, which is arranged in such a way that the second, lower and in particular the first, upper piston arrangement is adjustable by a pressure application to the second inner volume by way of the second compressed air duct from the retracted processing position into a transition position. The lower compressed air duct is thus connected to the second inner volume and enables an introduction of compressed air into this volume.

Moreover, the drive cylinder has an upper (first) compressed air duct, which is arranged in such a way that the first piston arrangement is adjustable by a pressure application to the first inner volume by way of the first compressed air duct from the transition position into the extended equipping position. The upper compressed air duct is thus connected to the first inner volume and enables an introduction of compressed air into this first volume.

In one embodiment, the upper compressed air duct can furthermore be formed and arranged in such a way that by means of a compressed air introduction through this duct, the first piston can be lifted and/or pressed from a zero position (i.e., the piston is located on a stop in a lowered, retracted position in the housing) into the equipping position.

Figure 2A:
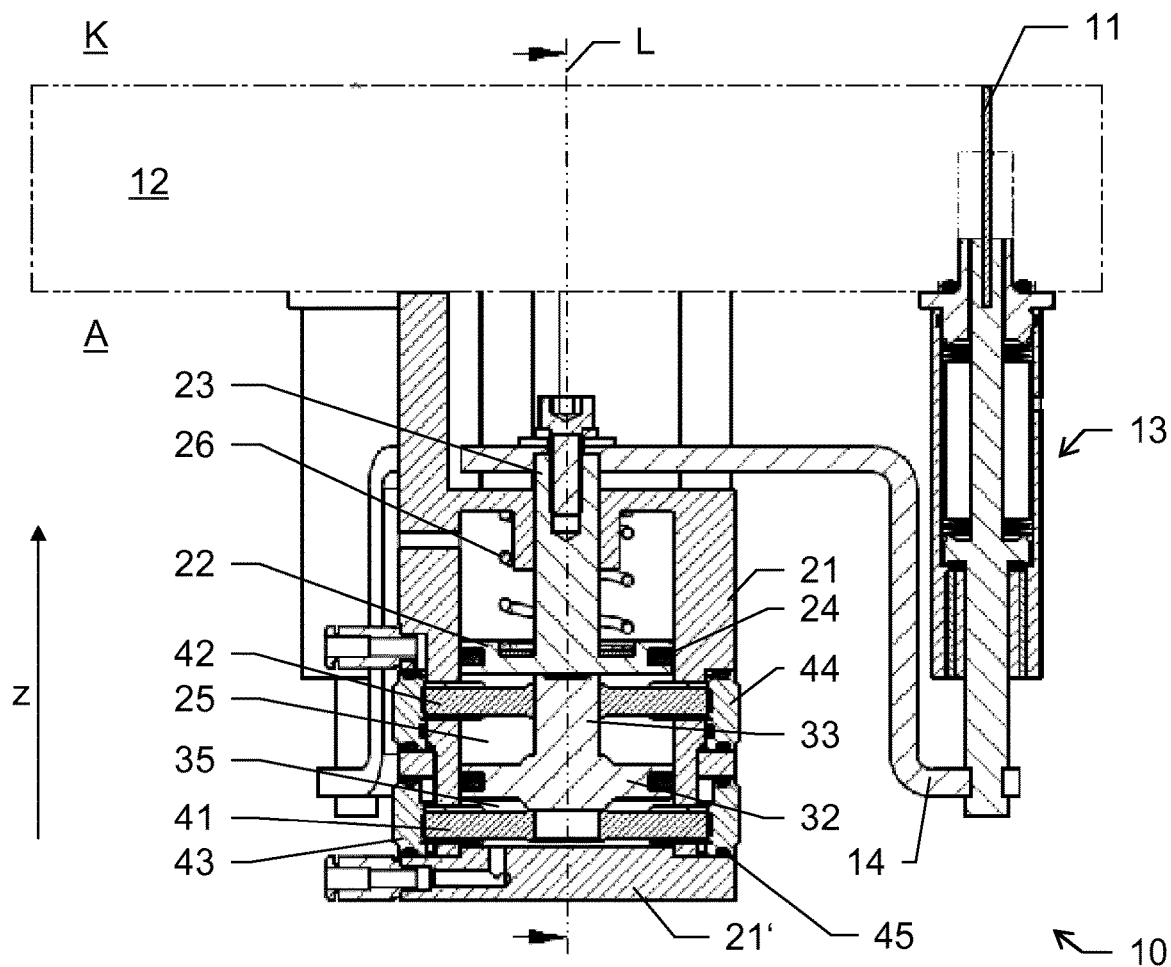
Figure 2B:
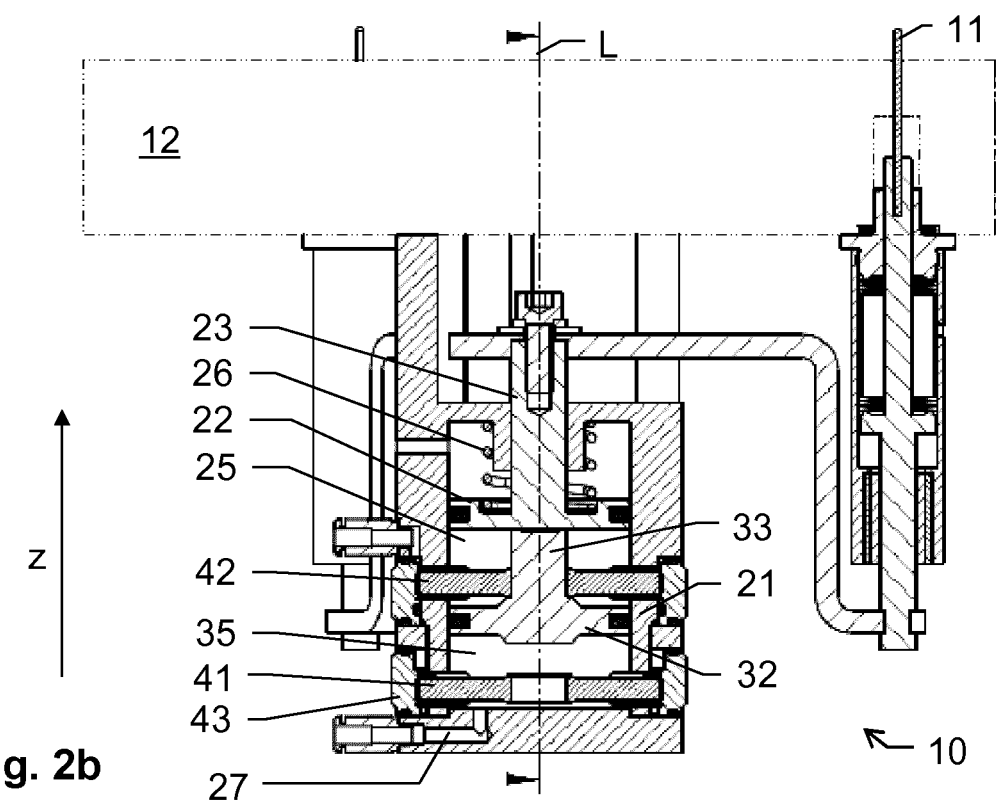
Figure 2C:
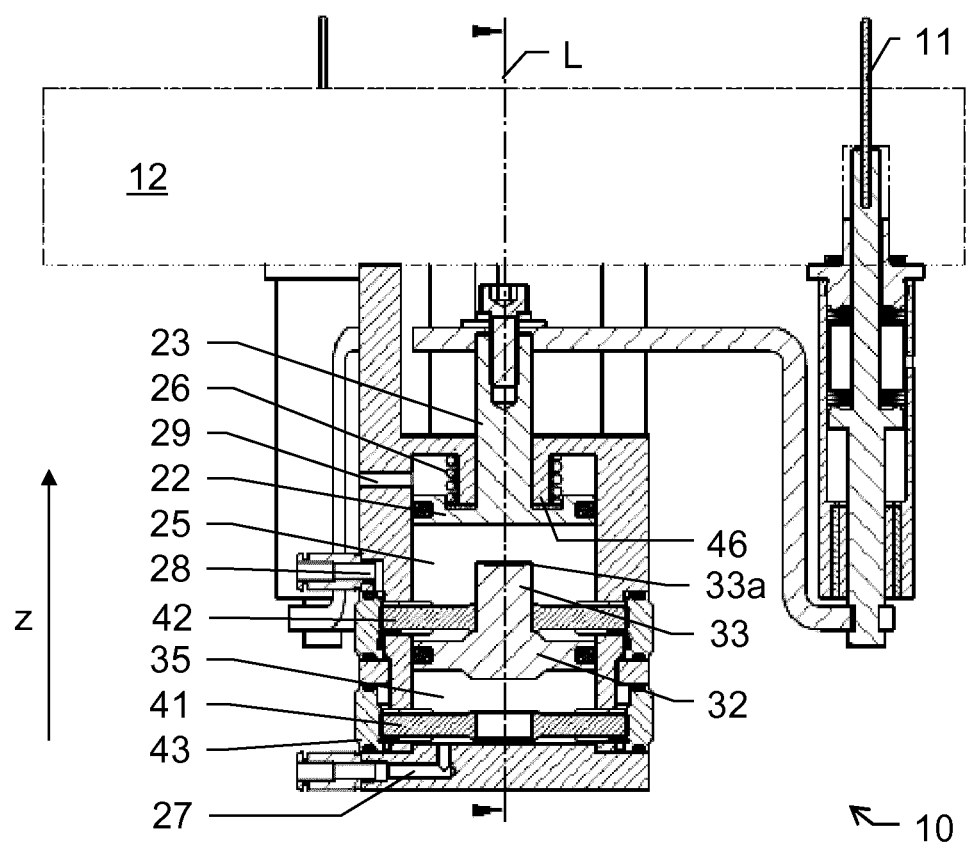
Figure 3A:
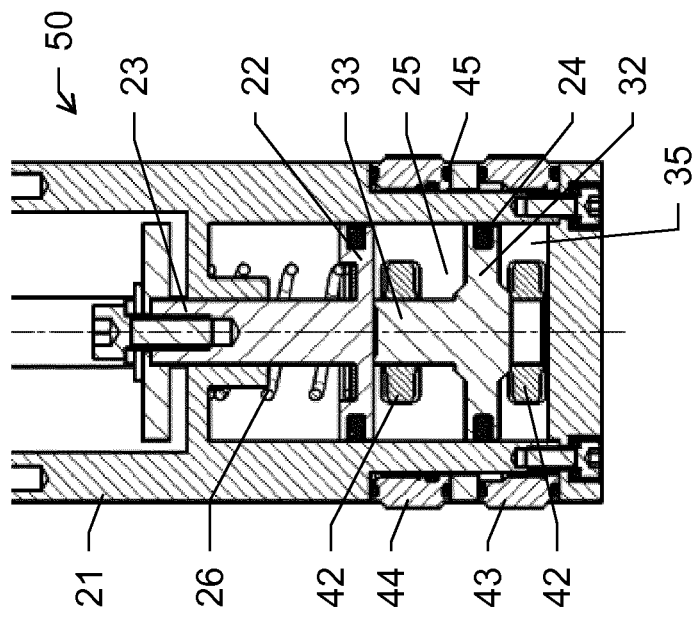
Figure 3B:
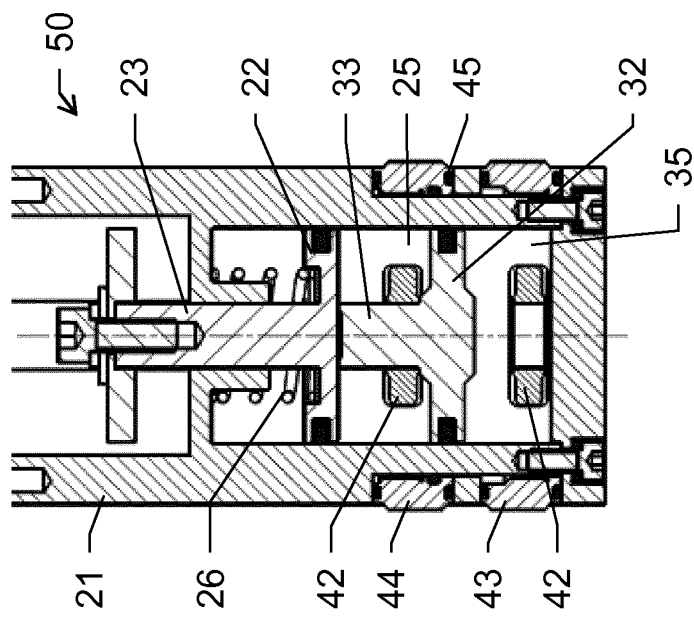
Figure 3C:
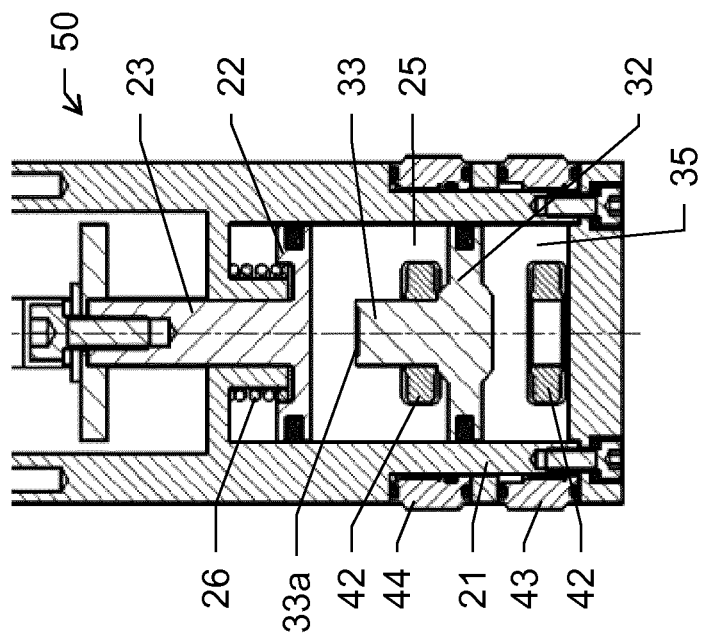
Figure 4:
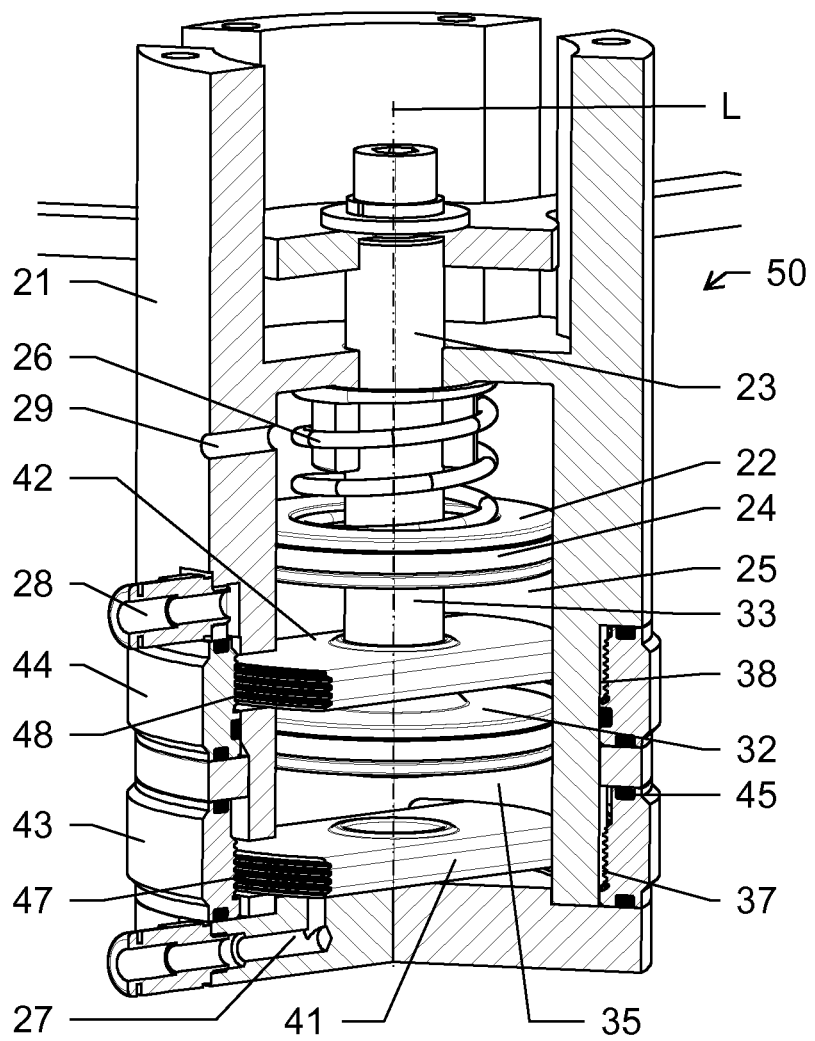
Figure 5:
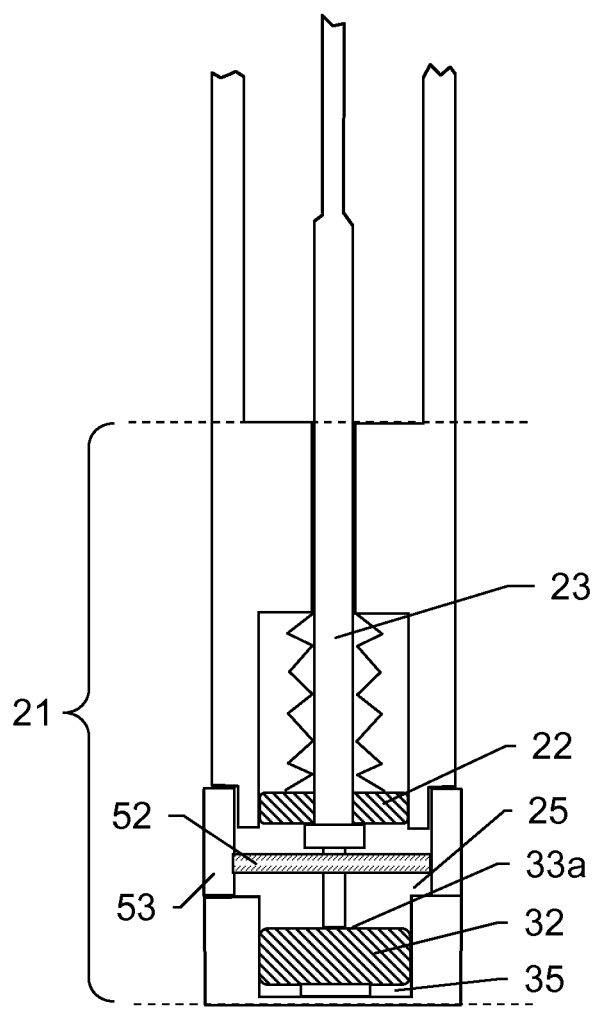

The devices according to the invention will be described in greater detail solely by way of example hereafter on the basis of specific exemplary embodiments schematically illustrated in the drawings, wherein further advantages of the invention will also be discussed. In the specific figures:

FIG. 1 shows a schematic illustration of an embodiment of a vacuum processing device for a wafer having a lifting device according to the invention;

FIGS. 2a-c show an embodiment of a pin lifting device according to the invention in a cross-sectional view;

FIGS. 3a-c show an embodiment of a drive and/or lift cylinder according to the invention in a cross-sectional view;

FIG. 4 shows a further embodiment of a drive and/or lift cylinder according to the invention in a perspective illustration; and FIG. 5 shows a further embodiment of a drive and/or lift cylinder according to the invention in cross section.

FIG. 1 schematically shows a process structure for processing of a semiconductor wafer 1 under vacuum conditions. The wafer 1 is introduced by means of a first robot arm 2 through a first vacuum transfer valve 5a into a vacuum chamber 4. The robot arm 2 enables depositing of the wafer 1 on extended support pins 7 therein (here: three pins shown) of a pin lifting device. The wafer 1 typically lies—as shown—on the robot arm or a support device provided on the robot arm 2, 3. After depositing of the wafer 1 on the pins 7, the robot arm is guided out of the chamber 4, the transfer valve 5a is closed, and the pins 7 are lowered. This takes place by means of a drive or lift cylinder 6, which is coupled to the three pins 7 and thus provides a joint movement of the pins 7. The wafer 1 is deposited in this way on the four support elements 8 shown. The drive or lift cylinder 6 forms, together with the coupled pins, the pin lifting device according to the invention. The structure and function of these components are described in detail with the following figures.

In this state, a planned processing (for example, coating) of the wafer 7 takes place under vacuum conditions and in particular in defined atmosphere (i.e., having a specific process gas).

For this purpose, the chamber 4 is coupled to a vacuum pump and preferably to a vacuum regulating valve for regulating the chamber pressure (not shown).

After the processing, lifting of the wafer 1 into a removal position in turn takes place by means of the pin lifting device. The wafer 1 is thereafter removed through the second transfer valve 5b using the second robot arm 3. Alternatively, the process can be conceived with only one robot arm, wherein equipping and removal can then take place through a single transfer valve.

FIGS. 2a-c show an embodiment of a pin lifting device 10 according to the invention in cross section. The device 10 is shown in three different states.

FIG. 2a shows the device 10 in a retracted processing position, in which typically processing of the substrate guided and deposited using the device takes place. In the processing position, the support pins 11 of the device 10, of which only a single one is shown here for reasons of comprehensibility, are lowered as far as possible. The description with reference to the one pin 11 shown can be transferred accordingly to further provided pins. In particular, the pin lifting device 10 has three support pins 11 in a star-shaped arrangement. In the embodiment shown, a contact region of the pin 11, with which the substrate is in contact in the scope of the lifting or lowering, is moved to a common level with a surface of a chamber wall 12 or a support 12 for the substrate.

The pins 11 are atmospherically separated from an outer chamber region A by respective coupling components 13. The pins 11 are thus provided in the chamber atmosphere K. The coupling component 13 has a bellows for this purpose, which provides a movement of the pin 11 in the z direction with simultaneous vacuum shielding. Alternatively to a bellows solution, the coupling component can also have a slide feedthrough or another vacuum-tight feedthrough (not shown).

The support pin 11 is connected by means of a connecting element 14 to a first, upper piston arrangement. The connecting element 14 is screwed together here with the outer end of a piston rod 23 of the piston arrangement. The pin 11 may be moved along accordingly by a movement of the piston arrangement in the z direction.

The first piston arrangement moreover has a piston 22, which is connected, integrally formed here, with the piston rod 23. The first piston arrangement is arranged in the interior of a housing 21 of a drive cylinder (lift cylinder). The housing 21 is preferably designed in such a way that a cylindrically formed inner wall is provided and the piston 22 is movable along a longitudinal axis L defined in this way (in and opposite to the z direction) in the interior of the housing 21. The piston rod 23 extends through the upper wall 21' (for example, integrally formed or screwed-on cover) of the housing 21 and is also movable correspondingly to the piston 22 along the longitudinal axis L.

The first piston 22 has a seal element 24, which is provided between the piston 22 and the inner wall of the housing 21 and provides a first pneumatic seal for a first, upper inner volume 25. The seal element 24 can be embodied, for example, as a z-shaped lip seal, whereby a defined and constant contact pressure can be provided on the inner wall.

The size of the first inner volume 25 is defined by an internal diameter and/or a cylinder footprint of the housing 21 and by a distance between the first piston 22 and a second, lower piston 32.

The first volume 25 is thus a variable volume which is changeable with respect to its spatial dimensions in dependence on a positioning of the first piston 22 and/or the second piston 32 along the longitudinal axis L. In other words: if the distance between the two pistons 22, 32 is decreased, the dimensions of the volume 25 are thus reduced accordingly; if the distance is increased, the volume 25 is thus also enlarged accordingly.

The second piston 32 separates the first inner volume 25 from a second inner volume 35. The second piston 32 is part of a second piston arrangement, which is also movable along the longitudinal axis L. The second piston 32 also has a seal element, which is peripherally arranged around the piston 32, for example, as a z-shaped lip seal and whereby a defined and constant contact pressure is provided on the inner wall. The second inner volume 35 is delimited as shown by the second piston 32 and a lower side 21' of the housing 21.

In the drive position shown, the retracted processing position, the second piston rod 33 is in contact with the first piston 22. As is apparent from FIGS. 2c and 3c, a contact surface 33a associated with the second piston arrangement is in contact with the first piston 22 in this case. The contact surface 33a forms the end of the second piston rod 33 in this case. A restoring force effectuated by the restoring spring 26 causes the first piston 22 and thus the entire piston arrangement to be pressed downward (opposite to the indicated z direction) and the second piston arrangement is also affected accordingly with the first piston arrangement due to the contact with the second piston arrangement. In this processing position, there is no pressure application to the two inner volumes 25 and 35 and/or the internal pressure is sufficiently low that the restoring force is nonetheless capable of the positioning shown of the two piston arrangements.

The lower, second piston 32 stops on a stop 41 in the processing position and is located in a lowest zero point position at the same time. The stop 41 is embodied as a crossbeam and extends transversely over the internal diameter of the housing 21 and furthermore into two opposing recesses, which are provided in the housing wall. Air can flow freely around the crossbeam 41 present in the second inner volume. This is also apparent in particular from FIGS. 3a-c.

A second and similarly formed stop 42 is provided between the first and the second piston 22, 32. This stop 42 forms, on the one hand, a stop point for movement of the second piston 32 from the retracted processing position into a transition position. The second stop 42 defines the transition position by way of its position along the longitudinal axis L.

In the embodiment shown, both the first stop 41 and also the second stop 42 are variable in the positioning thereof along the longitudinal axis L. The ability to set the positions of the stop 41, 42 is provided by means of respective positioning rings 43 and 44. The crossbeams 41 and 42 have for this purpose, on the beam ends thereof which are provided in the recesses, segments of an external thread and the rings 43 and 44 preferably each have a peripheral internal thread. The rings 43, 44 are arranged on the housing 21 and fitted in relation to the recesses in such a way that the internal threads of the rings 43, 44 interact with the external thread parts of the crossbeams 41, 42. The rings 43, 44 are moreover sealed with the housing 21. This seal is provided here by peripheral O-rings on the rings (one of the O-rings is identified by 45 here by way of example), which are fitted into corresponding grooves. The O-rings are thus provided between the rings 43, 44 and the housing wall. The O-rings are preferably greased to enable a homogeneous mobility (rotational movement) of the rings 43, 44.

The seal can in general consist of Teflon (PTFE), FKM, FFKM, or a mixed form thereof. The lubrication of the seal can be provided by grease. Alternatively or additionally, the seal element (for example, O-ring) and/or the seal surface (for example, groove) can have a specific coating for smooth running mobility of the rings and a required sealing action at the same time. The seal can be bonded, for example, to the ring or the housing, for example, vulcanized on.

By rotating one of the rings 43, 44, because of the interlocking of the internal thread with the external thread parts, the respective stop 41, 42 is displaced in its position in a direction parallel to the longitudinal axis L. The position of the stop can thus be changed and set in the scope of the extension of the recess, wherein the leak-tightness of the drive cylinder remains ensured and no engagement in the interior of the cylinder takes place.

For example, by rotating the lower ring 41, the retracted processing position (zero point position) can be set and a degree of lowering for the support pins 11 into the plate 12 can thus be set.

FIG. 2b shows the pin lifting device 10 in a transition state, i.e., the second, lower piston 32 is moved by means of pressure application to the second volume 35 into the transition position. In this case, the piston 32 has reached a further stop point, which is definable and settable accordingly by means of the crossbeam 42. The second piston rod 33 extends through a corresponding passage (recess) provided in the crossbeam 42.

The stroke of the piston arrangements into the transition position takes place due to an increase of the internal pressure in the second inner volume 35. The compressed air is introduced through a compressed air duct 27 connected to the second inner volume 35 and effectuates lifting of the second piston arrangement against the restoring force of the spring 26. A linear piston movement can thus be implemented by the pressure effectuated on the second piston 32. The first piston arrangement is accordingly also moved in the z direction at the same time by means of the second piston rod 33.

The transition position corresponds here to the farthest possible movement of the second piston 32 in the z direction. The transition position is in turn adjustable by the stop 42 and the ring 44.

A defined movement profile for the movement from the zero point position into the transition position can be set by a targeted pressure variation or pressure application. For example, the pressure is slowly increased in the second inner volume 35, so that an extension of the support pins 11 and lifting thus intended of a substrate can take place initially comparatively slowly and then with specific speed increase. Due to initially slow extension of the pins 11, careful lifting of the substrate and nondestructive overcoming of possibly occurring adhesion forces (for example, because of an air enclosure) can take place.

For this (passive) lifting movement of the first piston arrangement—pushed by the second piston arrangement—the first inner volume 25 can be provided in an aerated setting. However, the dimensions of the first inner volume 25 typically remain substantially constant in any case in this step and solely the location of the volume 25 in the housing 21 changes.

In addition to the careful handling of such substrates, the throughput, i.e., the time which is required for a process step, is an important factor in the processing of, for example, silicon wafers in a vacuum chamber. A solution for a pin lifter is therefore proposed by the present invention which, on the one hand, provides a corresponding cautious handling of the substrate (see above) and, on the other hand, enables a comparatively rapid positioning of the substrate in a removal position or equipping position, respectively. These two factors are fulfilled by the two-step drive concept.

In the second step, a state transition takes place from the transition position into an extended equipping position as shown in FIG. 2c. The position of the second piston 32 remains unchanged in this case. An overpressure is applied to the first inner volume 25 by way of a further pressure duct 28. The first piston 22 is thus pressed further in the z direction and lifted off of the second piston rod 33. The first piston 22 and the second piston rod are then provided without contact. The movement of the second piston 22 is in turn limited by a fixed stop 46. The spring 26 is provided fully compressed in particular here. In this case, a greater pressure increase is preferably applied to the first volume 25 than to the second volume 35, in order to implement faster lifting of the pins 11. This can be achieved with equal input pressure at both pressure ducts, for example, by means of a correspondingly larger flow rate aperture.

It is apparent that the fixed stop 46 solely embodies a design variant and this stop 46 can alternatively also be designed in accordance with one of the adjustable stops shown. Vice versa, the invention also relates to a drive cylinder in which only one of the provided stop points is adjustable.

The pressure application to the first volume 25 takes place either after reaching the transition position or chronologically overlapping with the pressure application to the second volume 25, so that a combined and correspondingly faster movement of the support pins 11 can be achieved. The control of these pressure applications can be executed by means of, for example, an electronic controller or by means of a switchover point, which switches over upon reaching a specific pressure of an applied pressure duct.

A venting and aeration duct is provided in the upper part of the housing 21, which prevents the occurrence of an overpressure or partial vacuum above the first piston 22 and thus enables an unobstructed movement of the first piston arrangement.

Restoring of the two piston elements into the retracted processing position, in particular wherein they again pass through the transition position, is carried out by monitored and possibly controlled venting of the two inner volumes 25, 35.

FIGS. 3a to 3c show an embodiment of a drive cylinder 50 (lift cylinder) according to the invention, wherein this cylinder is constructed similarly to those from FIGS. 2a-2c. Identical reference signs correspondingly identify equivalent or identically-acting parts. The drive cylinder 50 is also shown in three different positions—in the retracted processing position (FIG. 3a), in the transition position (FIG. 3b), and in the extended equipping position (FIG. 3c).

The description of the individual positions of the pin lifter and a lifting procedure executable thereby of FIGS. 2a-c are transferable accordingly to the drive cylinder 50.

The drive cylinder 50 can be used for a variety of different drive concepts. In particular, the cylinder 50 can be provided in a pin lifting device shown above.

FIG. 4 shows a further embodiment of a lift cylinder 50 (drive cylinder) according to the invention in a perspective illustration. The functionality substantially corresponds to that described above for FIGS. 2a-3c. Identical reference signs again accordingly identify equivalent or identically-acting parts of the drive 50.

A setting device according to the invention for the position of the two stops 41 and 42 (crossbeam) consisting of the two stop elements 41 and 42 and the positioning rings 43 and 44, respectively, interacting therewith is further illustrated in this case. In the embodiment shown, the stop elements 41 and 42 each have a segment of an external thread 47, 48 having defined pitch at the two opposing (short) ends thereof. As can be seen, the ends of the stop elements 41 and 42 extend into respective recesses of the housing 21 and are held in a twist-locked manner therein.

The two positioning elements 43 and 44, formed here as positioning rings 43 and 44, have respective peripheral internal threads 37 and 38 corresponding to the external threads 47 and 48. In other words, the internal threads 37 and 38 of the rings engage in the external threads 47 and 48 of the stop elements and enable a vertical adjustment of the stop elements along the longitudinal axis L by rotating the rings.

At least one of the two setting devices is designed in such a way that a variable positioning ability of the relevant stop element is provided over at least ±1 mm or ±2 mm. Furthermore, at least one of the two setting devices can be designed as self-inhibiting.

FIG. 5 shows a further embodiment of a lifting device according to the invention and/or for the drive thereof. The housing 21 again has a first piston 22 and a second piston 32, which are each axially movable in the housing by means of pressure application to the volumes 25 and 35.

A stop element 52 provides a stop point for the movement transition initiated by the second piston 32 in the movement procedure dominated by the first piston 22. A positioning ring 53 enables the axial adjustment of the position of the stop element 52.

In this embodiment, the first piston rod 23 extends through the first piston 22 and contacts a contact surface 33a of the second piston 32 in the processing position shown here. The second piston arrangement manages here without the second piston rod. The first piston 22 is screwed together with the first piston rod 23.

The first piston rod 23 extends beyond the housing 21 and can be coupled outside the housing 21 to a support pin of a pin lifter. In particular, the support pin is arranged in the axial extension of the piston rod 23.

Is apparent that the illustrated figures only schematically illustrate possible exemplary embodiments. According to the invention, the various approaches can also be combined with one another and with devices for substrate processing in vacuum process chambers of the prior art.

The invention claimed is:

1. A pin lifting device for the movement and positioning of a substrate to be processed, comprising:
    a pneumatic drive cylinder, comprising:

a cylindrical housing enclosing a first cylindrical inner volume and a first piston arrangement arranged movably along a movement axis extending parallel or coaxially in relation to a longitudinal axis (L), comprising a first piston and a first piston rod, wherein the longitudinal axis (L) is defined by the first cylindrical inner volume, the first piston delimits the first inner volume, the first piston rod protrudes out of the cylindrical housing, and the first piston arrangement is adjustable into an extended equipping position by a pressure application to the first inner volume, at least one support pin movable at least substantially parallel or coaxially in the direction of the longitudinal axis (L), wherein the support pin is connected to an outer end of the first piston rod provided outside the cylindrical housing and the support pin is linearly movable by a movement of the first piston arrangement, a first compressed air duct, and a second compressed air duct, and a control unit for activating respective compressed air regulating elements for the first and the second compressed air duct, wherein the drive cylinder has a second piston arrangement comprising a second piston and a contact surface, wherein the second piston delimits a second inner volume enclosed by the cylindrical housing, the second piston arrangement is movably arranged at least substantially coaxially in relation to the first piston arrangement, and the contact surface of the second piston arrangement faces in the direction of the first piston, and the first piston arrangement and the second piston arrangement are arranged in such a way that the first piston arrangement and the contact surface are provided without contact in the equipping position and the first piston arrangement and the contact surface are in contact in a retracted processing position, wherein the first compressed air duct is arranged in such a way that the first piston arrangement is adjustable from the transition position into the extended equipping position by a pressure application to the first inner volume by way of the first compressed air duct, wherein the second compressed air duct is arranged in such a way that the second piston arrangement is adjustable from the retracted processing position into a transition position by a pressure application to the second inner volume by way of the second compressed air duct, and wherein the control unit has a lifting function for moving the first piston arrangement into an extended equipping position configured in such a way that upon its execution the compressed air regulating element for the second compressed air duct provides the pressure application to the second inner volume and the compressed air regulating element for the first compressed air duct subsequently provides the pressure application to the first inner volume with a specific time offset in relation to the pressure application to the second inner volume, and wherein the time offset is dependent on reaching of the transition position by the second piston or is predetermined in a chronologically controlled manner by the lifting function.

2. The pin lifting device according to claim 1, wherein the drive cylinder defines at least one stop point for a movement of the first or the second piston arrangement, wherein the at least one stop point defines the extended equipping position, the retracted processing position, and/or the transition position, and the position of the at least one stop point is variable within a defined stop range along an adjustment axis extending at least substantially parallel to the longitudinal axis (L).

3. The pin lifting device according to claim 2, wherein the housing has at least two radially opposing recesses, wherein the recesses penetrate the housing wall, and an extension of the recesses along the adjustment axis defines the stop range.

4. The pin lifting device according to claim 3, wherein the drive cylinder has at least one stop element arranged in the recesses having a defined height in the direction of the adjustment axis, wherein the height is less than the extension of the recesses, and has at least one adjustment mechanism interacting with the stop element.

5. The pin lifting device according to claim 4, wherein the adjustment mechanism is designed as a ring having an internal thread and is arranged on the housing outer side, wherein the stop element has, in the region of the recesses, a segment of an external thread corresponding to the internal thread and the stop element is formed in such a way that the internal thread interacts with the external thread, and a position of the stop element is variable and settable within the defined stop range along the adjustment axis by means of rotation of the ring, wherein the at least one stop point is adjustable.

6. The pin lifting device according to claim 1, wherein the drive cylinder has at least one restoring functionality, by means of which a restoring force can be provided, which acts on the first and/or the second piston arrangement in such a way that it is pressed into the retracted processing position, wherein the restoring functionality is designed as a restoring element, which is arranged in such a way that the restoring force acts on the first piston, or a controllable, restoring mechanism, and wherein the restoring force on the first piston is settable by pressure application.

7. The pin lifting device according to claim 1, wherein the second piston arrangement has a second piston rod, an end surface of the second piston rod faces in the direction of the first piston arrangement, and the end surface represents the contact surface, wherein the first piston and the second piston rod are provided without contact in the equipping position and the first piston and the second piston rod are in contact in the retracted processing position, and/or the first piston rod is formed in such a way that a free inner end of the first piston rod, which is opposite to the outer end of the first piston rod, faces in the direction of the contact surface, and wherein the first piston rod and the contact surface are provided without contact in the equipping position and the first piston rod and the contact surface are in contact in a retracted processing position.

8. A pneumatic drive cylinder, comprising:

a cylindrical housing enclosing a first cylindrical inner volume and a first piston arrangement arranged movably along a movement axis extending parallel or coaxially in relation to a longitudinal axis (L), comprising a first piston and a first piston rod, wherein the longitudinal axis (L) is defined by the first cylindrical inner volume, the first piston delimits the first inner volume, the first piston rod protrudes out of the cylindrical housing, and the first piston arrangement is adjustable into an extended equipping position by a pressure application to the first inner volume, and a coupling element provided on an outer end of the first piston rod provided outside the cylindrical housing for connecting the first piston rod to a component to be moved by means of the drive cylinder, and a second piston arrangement comprising a second piston and a contact surface, wherein the second piston delimits a second inner volume enclosed by the cylindrical housing, in particular wherein the first and the second inner volume are separated from one another by the second piston, the second piston arrangement is movably arranged at least substantially coaxially in relation to the first piston arrangement, the contact surface faces in the direction of the first piston, and the second piston arrangement is adjustable from a retracted processing position into a transition position by a pressure application to the second inner volume, wherein the first piston arrangement and the second piston arrangement are arranged in such a way that the first piston arrangement and the contact surface are provided without contact in the equipping position and the first piston arrangement and the contact surface are in contact in a retracted processing position, wherein the drive cylinder defines at least one stop point for a movement of the first or the second piston arrangement, and wherein the at least one stop point defines the extended equipping position, the retracted processing position, and/or the transition position, and the position of the at least one stop point is variable within a defined stop range along an adjustment axis extending at least substantially parallel to the longitudinal axis (L).

9. The pneumatic drive cylinder according to claim 8, wherein the second piston arrangement has a second piston rod, an end surface of the second piston rod faces in the direction of the first piston arrangement, and the end surface represents the contact surface, wherein the first piston and the second piston rod are provided without contact in the equipping position and the first piston and the second piston rod are in contact in the retracted processing position.

10. The pneumatic drive cylinder according to claim 8, wherein the first piston rod is formed in such a way that a free inner end of the first piston rod, which is opposite to the outer end of the first piston rod, faces in the direction of the contact surface, wherein the first piston rod and the contact surface are provided without contact in the equipping position and the first piston rod and the contact surface are in contact in a retracted processing position.

11. The pneumatic drive cylinder according to claim 8, wherein the housing has at least two radially opposing recesses, wherein the recesses penetrate the housing wall, and an extension of the recesses along the adjustment axis defines the stop range.

12. The pneumatic drive cylinder according to claim 11, wherein the drive cylinder has at least one stop element arranged in the recesses having a defined height in the direction of the adjustment axis, wherein the height is less than the extension of the recesses, and has at least one adjustment mechanism interacting with the stop element.

13. The pneumatic drive cylinder according to claim 12, wherein the adjustment mechanism is designed as a ring having an internal thread and is arranged on the housing outer side, the stop element has, in the region of the recesses, a segment of an external thread corresponding to the internal thread and the stop element is formed in such a way that the internal thread interacts with the external thread, and a position of the stop element is variable and settable within the defined stop range along the adjustment axis by means of rotation of the ring, wherein the at least one stop point is adjustable.

14. The pneumatic drive cylinder according to claim 8, wherein the drive cylinder has at least one restoring functionality, by means of which a restoring force can be provided, which acts on the first and/or the second piston arrangement in such a way that it is pressed into the retracted processing position, wherein the restoring functionality is designed as a restoring element, which is arranged in such a way that the restoring force acts on the first piston, or a controllable, restoring mechanism, and wherein the restoring force on the first piston is settable by pressure application.

15. The pneumatic drive cylinder according to claim 8, wherein the drive cylinder has a first compressed air duct, which is arranged in such a way that the first piston arrangement is adjustable from the transition position into the extended equipping position by a pressure application to the first inner volume by way of the first compressed air duct, and the drive cylinder has a second compressed air duct, which is arranged in such a way that the second piston arrangement is adjustable from the retracted processing position into a transition position by a pressure application to the second inner volume by way of the second compressed air duct.

16. A pin lifting device wherein the drive cylinder is designed according to claim 8.

* * * * *